United States Patent
Inui

(10) Patent No.: US 6,522,575 B2
(45) Date of Patent: Feb. 18, 2003

(54) SEMICONDUCTOR MEMORY DEVICE HAVING MAGNETORESISTIVE ELEMENTS

(75) Inventor: Fumihiro Inui, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/985,968

(22) Filed: Nov. 7, 2001

(65) Prior Publication Data

US 2002/0064067 A1 May 30, 2002

(30) Foreign Application Priority Data

Nov. 8, 2000 (JP) ........................................ 2000-340640
Nov. 6, 2001 (JP) ........................................ 2001-340652

(51) Int. Cl.[7] .............................................. G11C 11/00
(52) U.S. Cl. ........................ 365/158; 365/171; 365/148; 365/189.01
(58) Field of Search ................................ 365/158, 171, 365/148, 189.01, 97, 157, 173, 154

(56) References Cited

U.S. PATENT DOCUMENTS 6,317,359 B1 * 11/2001 Black et al. ................ 365/158

* cited by examiner

Primary Examiner—David Lam
(74) Attorney, Agent, or Firm—Fitzpatrick, Cella, Harper & Scinto

(57) ABSTRACT

A semiconductor memory device is provided, which comprises a plurality of memory cells comprised of: a first MOS transistor and a second MOS transistor of which sources are grounded and of which gates are connected to the respective drains, a first magnetoresistive element inserted between the drain of the first MOS transistor and a power source line, and a second magnetoresistive element inserted between the drain of the second MOS transistor and the power source line, a first write unit for applying a predetermined voltage to the gate of the first MOS transistor and the gate of the second MOS transistor in accordance with write information with respect to the memory cell, and a read unit for reading the information written in the memory cell by detecting the potential of the drain of the first transistor and the drain of the second MOS transistor.

13 Claims, 7 Drawing Sheets

SEMICONDUCTOR MEMORY DEVICE HAVING MAGNETORESISTIVE ELEMENTS

BACKGROUND OF THE INVENTION

1. Field of the Invention

The present invention relates to a semiconductor memory device having a non-volatile memory cell including a magnetoresistive element such as a GMR (giant magnetoresistance) element or a TMR (spin tunneling magnetoresistance) element.

1. Related Background Art

Up to now, there has been well known an SRAM (static random access memory) as a semiconductor memory device that enables the read/write of information at a high speed. Hereinafter, as a first conventional example of the semiconductor memory device, a memory cell of the SRAM will be described with reference to FIG. 6.

FIG. 6 is a circuit diagram showing the structure of the memory cell of an SRAM which is a first conventional semiconductor memory device.

As shown in FIG. 6, the memory cell of the SRAM includes a first MOS transistor Q11 and a second MOS transistor Q12 whose sources are grounded and whose gates are connected to the mutual drains, a first load RL1 inserted between the drain of the first MOS transistor Q11 and a power source line, and a second load RL2 inserted between the drain of the second MOS transistor 012 and the power source line.

The drain of the first MOS transistor Q11 is connected with a first input/output terminal 11, and the drain of the second MOS transistor Q12 is connected with a second input/output terminal 12.

In the above structure, when information is written in the memory cell shown in FIG. 6, different voltages are applied to the first input/output terminal 11 and the second input/output terminal 12 by a writing means not shown, respectively. In this example, in the case where the supply voltage to the first input/output terminal 11 is equal to or higher than a threshold voltage of the MOS transistor and the supply voltage to the second input/output terminal 12 is lower than the threshold voltage of the MOS transistor, the second MOS transistor Q12 turns on to fix the potential of the second input/output terminal 12 to a ground potential GND, and the first MOS transistor Q11 turns off to fix the potential of the first input/output terminal 11 to a power source potential Vcc.

On the contrary, in the case where the supply voltage to the first input/output terminal 11 is lower than the threshold voltage of the MOS transistor and the supply voltage to the second input/output terminal 12 is equal to or higher than the threshold voltage of the MOS transistor, the second MOS transistor Q12 turns off to fix the potential of the second input/output terminal 12 to the power source potential Vcc, and the first MOS transistor Q110 turns on to fix the potential of the first input/output terminal 11 to the ground potential GND.

Therefore, the information can be recorded as binary data depending on which potential of the first input/output terminal 11 or the second input/output terminal 12 being higher. This state is maintained so far as the power is supplied if new information is not written. Because the output potentials of the first input/output terminal 11 and the second input/output terminal 112 are amplified by the MOS transistor and fixed to the power source potential Vcc or the ground potential GND, a potential difference necessary to detect the information can be sufficiently ensured, thereby being capable of facilitating a process of reading the information by the read means not shown and also being capable of conducting the read/write operation at a high speed.

Subsequently, the memory cell including a magnetoresistive element such as a GMR element or a TMR element will be described as a second conventional semiconductor memory device with reference to the accompanying drawings.

FIG. 7 is a circuit diagram showing the structure of the memory cell having a magnetoresistive element which is the second conventional semiconductor memory device.

As shown in FIG. 7, the second conventional memory cell includes a first magnetoresistive element R21 and a second magnetoresistive element R22 whose one terminals are grounded, respectively, a first MOS transistor Q21 inserted between the other terminal of the first magnetoresistive element R21 and a current supply line, and a second MOS transistor Q22 inserted between the other terminal of the second magnetoresistive element R22 and the current supply line.

The drains of the first MOS transistor Q21 and the second MOS transistor Q22 are connected to the current supply line, respectively, the source of the first MOS transistor Q21 is connected to the other terminal of the first magnetoresistive element R21, and the source of the second MOS transistor Q22 is connected to the other terminal of the second magnetoresistive element R22. Also, the gates of the first MOS transistor Q21 and the second MOS transistor Q22 are connected commonly to a control terminal 21, respectively.

The first magnetoresistive element R21 and the second magnetoresistive element R22 are formed of a GMR element or a TMR element and are so structured as to have two magnetic layers different in coercive force, respectively, and a non-magnetic layer intervened therebetween. The first magnetoresistive element R21 and the second magnetoresistive element R22 are elements exhibiting different resistances depending on the magnetizing direction of those two magnetic,layers being in the same direction or in opposite direction.

A first write line 22 for controlling the magnetizing direction of the magnetic layer of the first magnetoresistive element R21 is disposed at a position that is close to the first magnetoresistive element R21, and a second write line 23 for controlling the magnetizing direction of the magnetic layer of the rsecond magnetoresistive element R22 is disposed at a position that is close to the second magnetoresistive element R22.

In this structure, when information is written in the memory cell shown in FIG. 7, write currents are allowed to flow in the first write line 22 and the second write line 23 in opposite directions by the write means not shown, and the magnetic layers are magnetized by a magnetic field developed around the write line so that the resistances of the first magnetoresistive element R21 and the second magnetoresistive element R22 are different from each other.

The information can be recorded as binary data depending on which resistance of the first magnetoresistive element R21 and the second magnetoresistive element R22 being larger. Because the resistances of the first magnetoresistive element R21 and the second magnetoresistive element R22 are not. changed even if the power source turns off unless new information is written in those elements, respectively, the memory cell shown in FIG. 7 functions as the non-volatile memory cell.

On the other hand, when the information is read from the memory cell shown in FIG. 7, a given voltage is applied to the control terminal 21 by a read means not shown, the first MOS transistor Q21 and the second MOS transistor Q22 are turned on to apply the same voltage to the first magnetoresistive element R21 and the second magnetoresistive element R22, respectively. In this situation, because currents corresponding to the respective resistances flow in the first magnetoresistive element R21 and the second magnetoresistive element R22, respectively, and a current difference occurs between a current I21 that flows in the first magnetoresistive element R21 and a current I22 that flows in the second magnetoresistive element, the written information can be read by detecting the current difference by the read means.

However, among the above-mentioned conventional semiconductor memory devices, because the memory cell of the first conventional SRAM is the volatile memory cell, the information written at the same time when the power source turns off disappears. On the other hand, in the memory cell having the second conventional magnetoresistive element, because the information is rewritten by changing the magnetizing direction of the magnetic layers, there is a fear that the information disappears due to the creep phenomenon by a change in the frequent magnetizing direction. The creep phenomenon is directed to a phenomenon in which the magnetizing direction is naturally reversed when the magnetizing direction of the magnetic layers of the GMR element and the TMR element changes over the given number of times of repetitive write (the maximum number of times of repetitive write).

SUMMARY OF THE INVENTION

The present invention has been made to solve the above-mentioned problems with the conventional arts, and therefore an object of the present invention is to provide a semiconductor memory device that improves the maximum number of times of repetitive write while the semiconductor memory device is a non-volatile memory cell having a magnetoresistive element such as a GMR element or a TMR element.

In order to solve the above-mentioned problems, according to the present invention, there is provided a semiconductor memory device, which comprises: a plurality of memory cells comprised of: a power source and first and second MOS transistors whose sources are grounded and whose gates are connected to the respective drains; a first magnetoresistive element inserted between the drain of the first MOS transistor and a power source line; and a second magnetoresistive element inserted between the drain of the second MOS transistor and the power source line; first write means for applying a voltage equal to or higher than a threshold voltage of the MOS transistor to any one of the gates of the first and second MOS transistors in accordance with write information with respect to the memory cell; and read means for reading the information written in the memory cell by detecting the drain potentials of the first and second MOS transistors.

Also, there is provided a semiconductor memory device, in which each of the first and second magnetoresistive elements includes two magnetic layers different in a coercive force from each other, and a non-magnetic layer interposed between the magnetic layers, respectively, and the resistances of the first magnetoresistive element and the second magnetoresistive element are different depending on the relative magnetizing directions of the two magnetic layers.

Also, there is provided a semiconductor memory device, further including: a first write line for magnetizing at least one magnetic layer of the first magnetoresistive element, to which a magnetic field is applied, in a predetermined direction due to the magnetic field caused by a current, in which a write current for controlling the resistance of the first magnetoresistive element; a second write line for magnetizing at least one magnetic layer of the second magnetoresistive element, to which a magnetic field is applied, in a predetermined direction due to the magnetic field caused by a current, in which a write current for controlling the resistance of the second magnetoresistive element; potential detecting means for detecting the potentials of the drains of the first and second MOS transistors before a supply voltage is not applied to the power source line; a second write means for allowing a write current in a predetermined direction to flow the first write line and/or the second write line in accordance with the potential relationship of the drains of the first and second MOS transistors which is detected by the potential detecting means, respectively; and information reproducing means for applying a predetermined voltage to the gates of the first and second MOS transistors in accordance with the resistance of the first and second magnetoresistive element after the power is supplied to the power source line, respectively, which is preferable.

Also, it is preferable that the first magnetoresistive element and the second magnetoresistive element may be a TMR element, respectively, whereby the magnetoresistance ratio is large.

Also, it is preferable that the magnetic film of the magnetoresistive element may be magnetized in a direction perpendicular to a film surface, whereby a memory element can be downsized.

Also, it is preferable that the first write line and the second write line may be made common in each of the memory cells, whereby a memory can be downsized.

According to the present invention, there is provided a semiconductor memory device having a plurality of memory cells, in which each of the memory cells includes first and second inverters which has a power source line, a MOS transistor and a variable resistor, and forms a flip flop by connecting the first and second inverters annularly; in which the semiconductor memory device is comprised of first write means for applying a voltage to any one of the gates of the MOS transistors in accordance with write information with respect to the memory cell, and second write means for recording the information by changing the resistance of the variable resistor.

Also, it is preferable that the variable resistor may include a magnetoresistive element, whereby recording at a high speed is possible and it is non-volatile.

More detail will be described later in the preferred embodiments.

BRIEF DESCRIPTION OF THE DRAWINGS

FIGS. 2A and 2B are diagrams showing the structure of the magnetoresistive element formed of the GMR element, in which FIG. 2A is a cross-sectional view showing an example in which the magnetizing direction is horizontal with respect to the magnetic layer face, and FIG. 2B is a cross-sectional view showing an example in which the magnetizing direction is perpendicular to the magnetic layer face;

FIGS. 3A and 3B are diagrams showing the structure of the magnetoresistive element formed of the TMR element, in which FIG. 3A is a cross-sectional view showing an example in which the magnetizing direction is horizontal with respect to the magnetic layer face, and FIG. 3B is a cross-sectional view showing an example in which the magnetizing direction is perpendicular to the magnetic layer face;

FIGS. 4A, 4B, 4C and 4D are diagrams showing a method of writing the information with respect to the magnetoresistive element shown in FIG. 1, in which FIGS. 4A and 4B are schematic views showing an appearance in which the magnetizing direction is in parallel with the magnetic layer face, and FIGS. 4C and 4D are schematic views showing an appearance in which the magnetizing direction is perpendicular to the magnetic layer face;

DESCRIPTION OF THE PREFERRED EMBODIMENTS

Now, a description will be given in more detail of preferred embodiments of the present invention with reference to the accompanying drawings.

Figure 1:
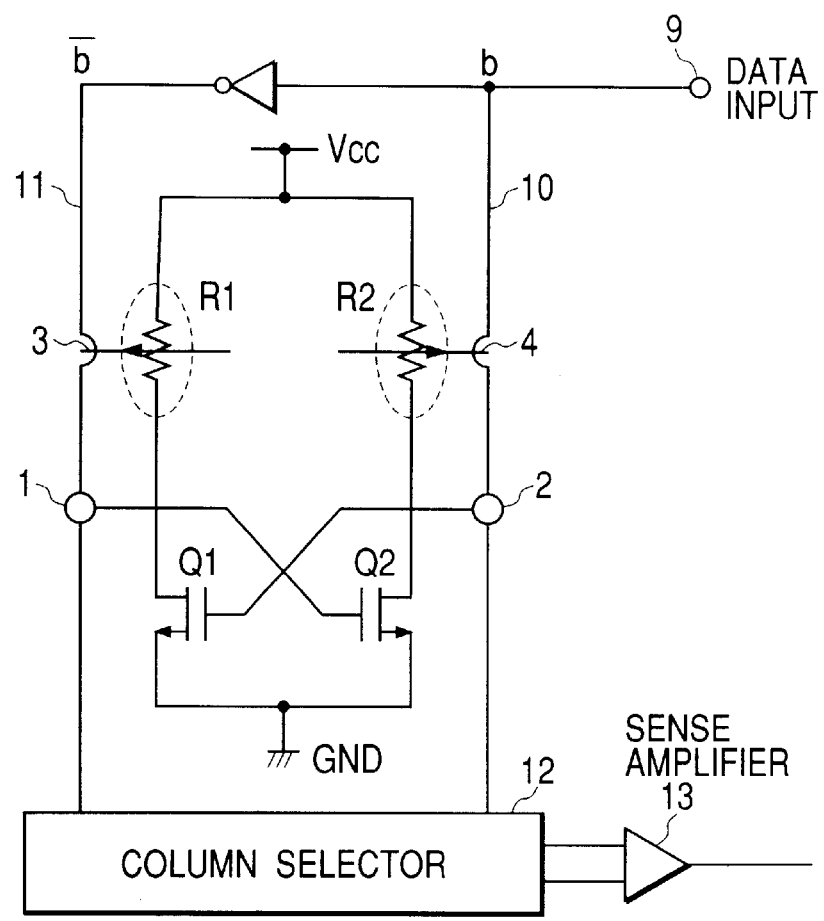
FIG. 1 is a circuit diagram showing one structural example of a memory cell included in a semiconductor memory device of the present invention.

FIG. 1 is a circuit diagram showing one structural example of a memory cell included in a semiconductor memory device of the present invention.

As shown in FIG. 1, the memory cell provided in the semiconductor memory device according to the present invention includes a first MOS transistor Q1 and a second MOS transistor Q2 whose sources are grounded and whose gates are connected to the respective drains, a first magnetoresistive element R1 inserted between the drain of the first MOS transistor Q1 and a power source line, and a second magnetoresistive element R2 inserted between the drain of the second MOS transistor Q and the power source line.

A first inverter is formed of the first MOS transistor, the first magnetoresistive element and the power source line connected to the power source, and a second inverter is formed of the second MOS transistor, the second magnetoresistive element and the power source line connected to the power source. Both of the first inverter and the second inverter are connected to each other in an annular manner to form a flip flop. Information is retained by the flip flop structure while the power is supplied.

The drain of the first MOS transistor Q1 is connected with the first input/output terminal 1, and the drain of the second MOS transistor Q2 is connected with the second input/output terminal 2. The first magnetoresistive element R1 and the second magnetoresistive element R2 are formed of a GMR element or a TMR element, and have two magnetic layers different in coercive force from each other and a non-magnetic layer intervening between those magnetic layers. The non-magnetic layer becomes the GMR element in the case where an electroconductor is interposed between the magnetic layers and becomes the TMR element if an insulator is interposed between the magnetic layers. In the present invention, any element of the GMR element and the TMR element may be employed, but it is preferable to employ the TMR element because the magnetoresistance ratio is large. The first magnetoresistive element R1 and the second magnetoresistive element R2 are elements that exhibit different resistances depending on the magnetizing directions of those two magnetic layers being identical with each other or opposite to each other, that is, the relative magnetizing directions of both of the magnetic layers. In this case, the identical directions mean that the magnetizing directions are in parallel and equal to each other in orientation (called "parallel state"), and the opposite directions mean that the orientations are opposite to each other (called "anti-parallel state"). Also, a first write line 3 for controlling the magnetizing direction of at lease one magnetic layer of the first magnetoresistive element R1 is disposed at a position close to the first magnetoresistive element R1, and a second write line 4 for controlling the magnetizing direction of at lease one magnetic layer of the second magnetoresistive element R2 is disposed at a position close to the second magnetoresistive element R2. A current is made to flow in those write lines to develop a magnetic field, thereby conducting writing.

In the above-mentioned structure, the memory cell shown in FIG. 1 operates in accordance with information inputted to the input/output terminal in a state where the power is supplied, and functions as a non-volatile memory that retains the information due to a difference in the resistance between the first magnetoresistive element R1 and the second magnetoresistive element R2 in a state where the power source turns off. That is, the memory cell reads the information due to the potentials of the drains of the respective transistors as in the normal SRAM when the power is supplied, and retains the information retained by the SRAM due to the resistance of the magnetoresistive element when the power source turns off.

During the normal operation where the power is supplied, in order to write the information in the memory cell shown in FIG. 1, opposite information is inputted to bit lines 10 and 11 from a DATA input section 9 to supply a voltage to the first input/output terminal 1 and the second input/output terminal 2. In this example, in the case where the supply voltage to the first input/output terminal 1 is equal to or higher than a threshold voltage of the MOS transistor, and the supply voltage to the second input/output terminal 2 is lower than the threshold voltage of the MOS transistor, the second MOS transistor Q2 turns on to fix the potential of the second input/output terminal 2 to the ground potential GND, and the first MOS transistor Q1 turns off to fix the potential of the first input/output terminal 1 to a power source potential Vcc.

On the contrary, in the case where the supply voltage to the first input/output terminal 1 is lower than the threshold voltage of the MOS transistor, and the supply voltage to the second input/output terminal 2 is equal to or higher than the threshold voltage of the MOS transistor, the second MOS transistor Q2 turns off to fix the potential of the second input/output terminal 2 to the power source potential Vcc, and the first MOS transistor Q1 turns on to fix the potential of the first input/output terminal 1 to the ground potential GND.

Therefore, the information can be recorded as binary data by comparing the potentials of the first input/output terminal 1 and the second input/output terminal 2. Also, unless new information is written, the data is retained so far as the power is supplied. In addition, because the output potentials of the first input/output terminal 1 and the second input/output terminal 2 are amplified by the MOS transistor and fixed to the power source potential Vcc or the ground potential GND, a potential difference necessary to detect the information can be sufficiently ensured, thereby being capable of facilitating an information reading process due to the read means and conducting the high-speed read/write operation. An actual read is made in such a manner that a specific memory cell is selected by a column selector, and the potentials of the bit lines 10 and 11 are compared with each other by a sense amplifier to read the information in FIG. 1.

Subsequently, the information retaining operation at the time when the power source turns off will be described.

In the semiconductor memory device having the memory cell shown in FIG. 1, the output potentials of the first input/output terminal and the second input/output terminal are detected by a potential detecting means formed of, for example, the sense amplifier 13 before the power source turns off. Then, a given write current is allowed to flow by the write means formed of the first write line 3, the second write line 4 and so on in accordance with the detected result to apply a magnetic field to the magnetic layers of the first magnetoresistive element R1 and the second magnetoresistive element R2, the magnetizing directions of the magnetic layers are set, and any one of the above-mentioned parallel state and the anti-parallel state is produced to set the respective resistances.

For example, if the detected result of the potential detecting means satisfies that the potential of the first input/output terminal 1 is larger than the potential of the second input/output terminal 2, a write current of the given direction flows in the first write line 3 and the second write line 4 so that the resistance of the first magnetoresistive element R1 is smaller than the resistance of the second magnetoresistive element R2, to thereby determine the magnetizing states of the first magnetoresistive element R1 and the second magnetoresistive element R2. Thereafter, even if the power source turns off, because the information written in the memory cell before the power source turns off is retained as a difference in the resistance between the first magnetoresistive element R1 and the second magnetoresistive element R2, the semiconductor memory device can function as the non-volatile memory cell.

On the other hand, in the case where the power is supplied to the semiconductor memory device having the memory cell shown in FIG. 1, the information retained in the memory cell is reproduced by the following information reproducing means in the semiconductor memory device.

For example, in the case where the resistance of the first magnetoresistive element R1 is set to be larger than the resistance of the second magnetoresistive element R2 when the power source turns off, if the potential of the power source line goes up from the ground potential GND to the Vcc at the time when the power source turns on, a larger current flows in the second magnetoresistive element R2 than that in the first magnetoresistive element R1, and the potential applied to the gate of the first MOS transistor Q1 reaches the potential that exceeds the threshold voltage of the MOS transistor prior to the potential applied to the gate of the second MOS transistor Q2.

Therefore, because the first MOS transistor Q1 turns on in advance, and the gate potentials of the first input/output terminal 1 and the second MOS transistor Q2 are drawn to the ground potential GND, respectively, to turn off the second MOS transistor Q2, the potential of the first input/output terminal 1 is fixed to the ground potential GND, and the potential of the second input/output terminal 2 is fixed to the power source potential Vcc.

In this way, the difference in the resistance between the first magnetoresistive element R1 and the second magnetoresistive element R2 is converted into the potential difference of the first input/output terminal 1 and the second input/output terminal 2 when the power source turns on, to thereby reproduce the information retained in the memory cell.

The information reproducing means is not limited to the above-mentioned manner. For example, in the case where the resistance of the first magnetoresistive element R1 is set to be larger than the resistance of the second magnetoresistive element R2 when the power source turns off, the same voltage which is equal to or lower than the threshold value of the MOS transistor is applied to the first input/output terminal 1 and the second input/output terminal 2 when the power turns on, respectively. In this situation, because the currents corresponding to the respective resistances flow in the first magnetoresistive element R1 and the second magnetoresistive element R2, respectively, the current values outputted from the first input/output terminal 1 and the second input/output terminal 2 are monitored, respectively, thereby being capable of detecting the resistances of the first magnetoresistive element R1 and the second magnetoresistive element R2, respectively.

Thus, if the supply voltages to the first input/output terminal 1 and the second input/output terminal 2 are reset on the basis of the detected results, respectively, the information retained in the memory cell can be reproduced in a similar manner described above.

Therefore, according to the structure of the present invention, the high-speed information write/read can be conducted in the normal operation where the power is supplied, and the memory cell having the non-volatile can be obtained. In particular, because the information is retained by rewriting the magnetizing direction of the magnetoresistive element only when the power turns off, the number of times of changes in the magnetizing direction is reduced, and the maximum number of times of repetitive write can be increased. Also, because the write of the information in the magnetoresistive element is made by the magnetization reverse of the magnetic layers, the recording time is reduced.

Then, the structure of the first magnetoresistive element and the second magnetoresistive element shown in FIG. 1 will be described with reference to FIGS. 2A, 2B and 3A, 3B.

Figure 2A:
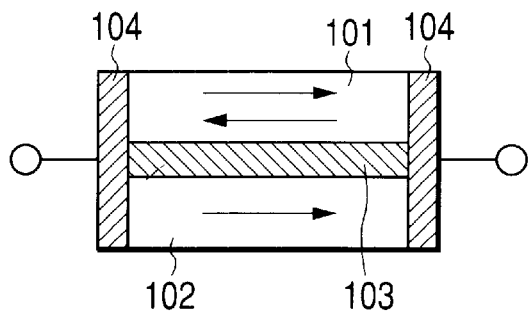
Figure 2B:
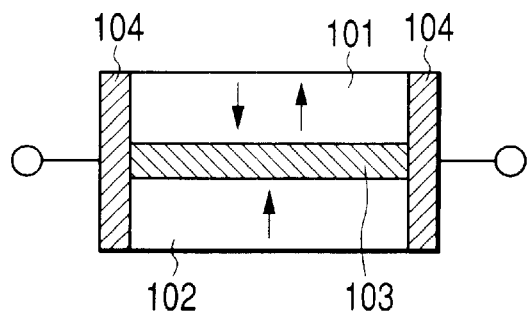
Figure 3A:
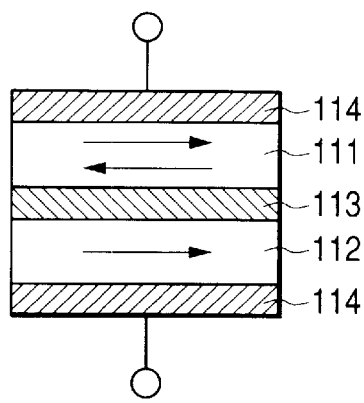
Figure 3B:
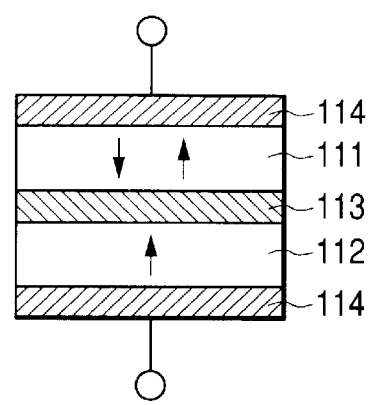

FIGS. 2A and 2B are diagrams showing the structure of the magnetoresistive element formed of the GMR element, in which FIG. 2A is a cross-sectional view showing an example in which the magnetizing direction is horizontal with respect to the magnetic layer face, and FIG. 2B is a cross-sectional view showing an example in which the magnetizing direction is perpendicular to the magnetic layer face. Also, FIGS. 3A and 3B are diagrams showing the structure of the magnetoresistive element formed of the TMR element, in which FIG. 3A is a cross-sectional view showing an example in which the magnetizing direction is horizontal with respect to the magnetic layer face, and FIG. 3B is a cross-sectional view showing an example in which the magnetizing direction is perpendicular to the magnetic layer face.

As shown in FIGS. 2A and 2B, the magnetoresistive element formed of the GMR element includes a first magnetic layer 101 whose coercive force is relatively small, a second magnetic layer 102 whose coercive force is relatively large, and a non-magnetic electroconductive layer 103 interposed between the first and second magnetic layers 101 and 102, and electrodes 104 are disposed on both end faces of the magnetoresistive element as shown in FIGS. 2A and 2B. Likewise, the magnetoresistive element formed of the GMR element includes a first magnetic layer 111 whose coercive force is relatively small, a second magnetic layer 112 whose coercive force is relatively large, and a non-magnetic insulating layer 113 interposed between the first and second magnetic layers 111 and 112, and electrodes 114 are disposed on the first magnetic layer 111 and the second magnetic layer 112 as shown in FIGS. 3A and 3B. As shown in the figure, the magnetic layers 101 and 111 can take at least two magnetizing directions due to the magnetic field developed by allowing the current to flow in the write lines.

The magnetoresistive element has a resistance which is relatively smaller in the case where the magnetizing directions of the first magnetic layer and the second magnetic layer are in parallel with each other, and relatively larger in the case where they are in anti-parallel. Normally, the magnetizing direction of the second magnetic layer is fixed, and the magnetizing direction of the first magnetic layer is changed to control the resistance of the magnetoresistive element, thereby conducting the information write operation.

Then, a method of writing the information with respect to the magnetoresistive element shown in FIG. 1 will be described with reference to FIGS. 4A to 4D.

Figure 4A:
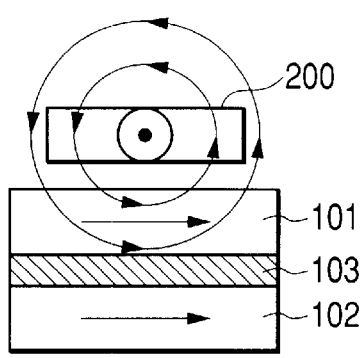
Figure 4B:
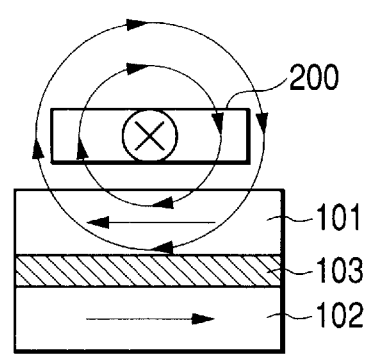
Figure 4C:
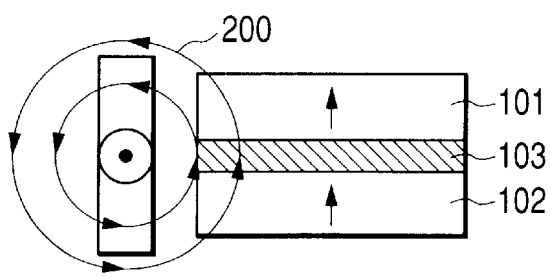
Figure 4D:
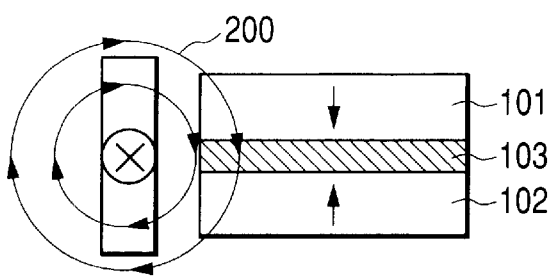

FIGS. 4A to 4D are diagrams showing a method of writing the information with respect to the magnetoresistive element shown in FIG. 1. FIGS. 4A and 4B are schematic views showing an appearance in which the magnetizing direction is in parallel with the magnetic layer face, and FIGS. 4C and 4D are schematic views showing an appearance in which the magnetizing direction is perpendicular to the magnetic layer face. FIGS. 4A and 4C show the magnetic field developed in the write line when the current is allowed to flow in the front direction from the depthwise direction with respect to the paper surface and the magnetizing direction of the magnetic layer, and FIGS. 4B and 4D show the magnetic field developed in the write line when the current is allowed to flow from the front direction toward the depthwise direction with respect to the paper surface and the magnetizing direction of the magnetic layer.

Also, although FIGS. 4A to 4D show examples in which the information is written in the GMR element shown in FIGS. 2A and 2B, the same is applied to the TMR element shown in FIGS. 3A and 3B. Also, although any magnetoresistive element in any one of the film face horizontal direction or the film face perpendicular direction with respect to the magnetizing direction, it is preferable to use the magnetoresistive element in the film face perpendicular direction because downsizing of the device is enabled.

In order to control the resistance of the magnetoresistive element, a write line 200 is disposed close to the magnetoresistive element as shown in FIGS. 4A to 4D, and a write current is allowed to flow in the write line 200 to develop a magnetic field, and the magnetic field is applied to the magnetic layer of the magnetoresistive element to determine the magnetizing direction.

The magnitude of the magnetic field developed due to the write current is set to the degree where only the magnetizing direction of the first magnetic layer 101 whose coercive force is relatively small can be changed, and an orientation along which the write current flows is changed to control the magnetizing direction of the first magnetic layer 101. For example, in FIGS. 4A and 4C, the write current is allowed to flow toward the paper surface from the depthwise direction to develop the counterclockwise magnetic field, to thereby magnetize the first magnetic layer 101 clockwise. Also, in FIGS. 4B and 4D, the write current is allowed to flow from the front side toward the depthwise direction with respect to the paper surface to develop the clockwise magnetic field, to thereby magnetize the first magnetic layer 101 counterclockwise.

The second magnetic layer 102 is relatively high in the coercive force, and the resistance of the magnetoresistive element becomes low, when the magnetizing directions of the first magnetic layer 101 and the second magnetic layer 102 coincide with each other as shown in FIGS. 4A and 4C, and becomes high when the magnetizing directions of the first magnetic layer 101 and the second magnetic layer 102 are opposite to each other as shown in FIGS. 4B and 4D.

Then, the semiconductor memory device having a plurality of memory cells two-dimensionally shown in FIG. 1 will be described with reference to FIG. 5.

Figure 5:
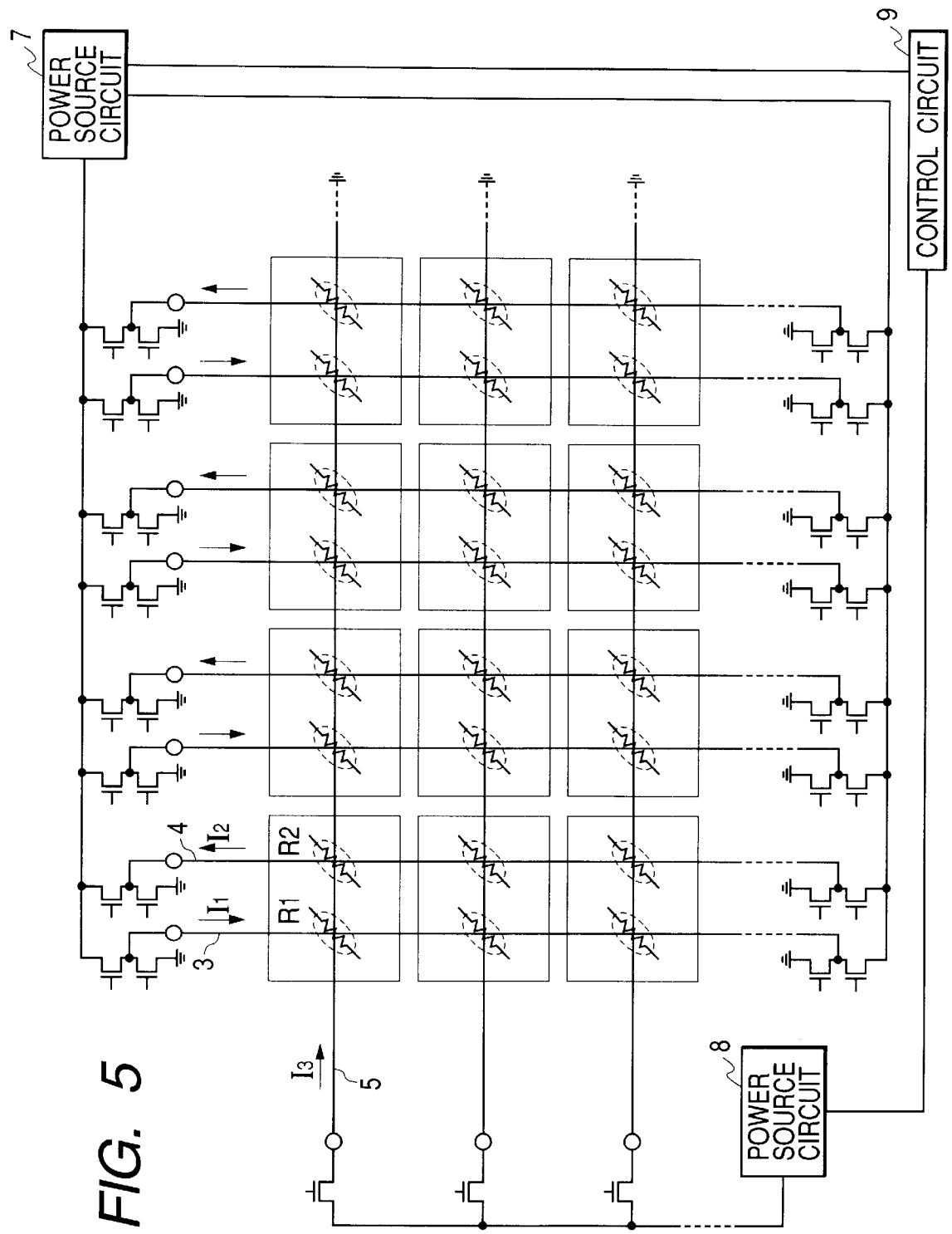
FIG. 5 is a plan view showing one structural example of the semiconductor memory device having a plurality of memory cells shown in FIG. 1.
Figure 6:
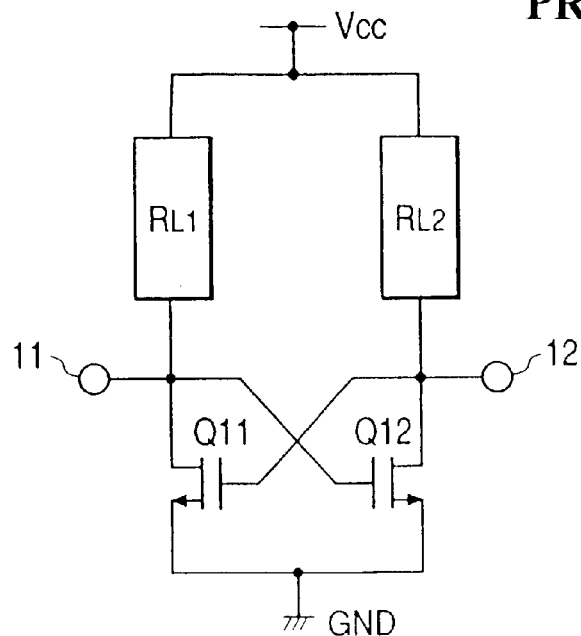
FIG. 6 is a circuit diagram showing the structure of the memory cell of an SRAM which is a first conventional semiconductor memory device.
Figure 7:
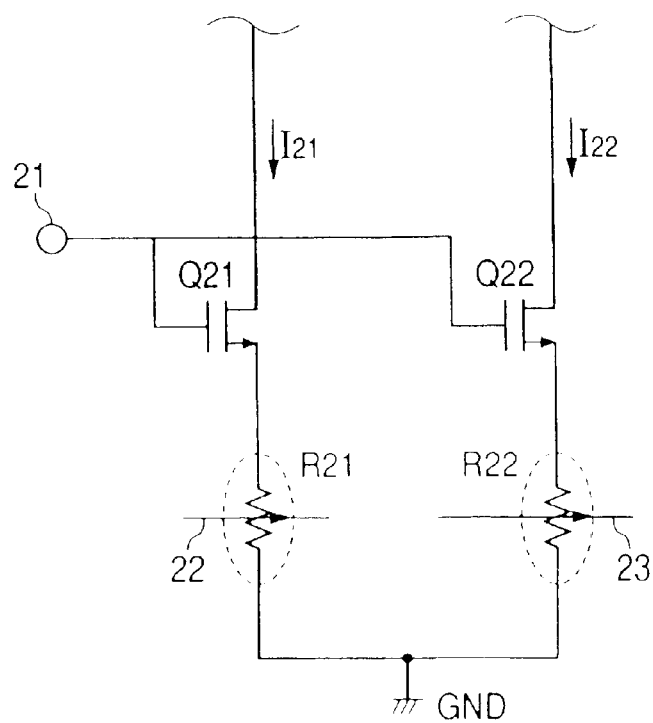
FIG. 7 is a circuit diagram showing the structure of the memory cell having a magnetoresistive element which is the second conventional semiconductor memory device.

FIG. 5 is a plan view showing one structural example of the semiconductor memory device having a plurality of memory cells shown in FIG. 1. In FIG. 5, the first MOS transistor, the second MOS transistor and the control line connected to the first input/output terminal and the second input/output terminal are omitted.

As shown in FIG. 5, the semiconductor memory device according to this embodiment is so structured as to arrange a plurality of memory cells shown in FIG. 1 in a lattice. A first write line 3 is disposed at a position close to the first magnetoresistive element R1 in the column direction of each of the memory cells arranged in the lattice, and a second write line 4 is disposed at a position close to the second magnetoresistive element R2. Also, a third write line 5 is disposed at apposition close to the first magnetoresistive element R1 and the second magnetoresistive element R2 in the row direction of the respective memory cells 10 arranged in the lattice.

In the above-mentioned structure, when information is written, the power is supplied from the power source circuit 7 so that the magnetic field is applied to the first magnetoresistive element R1 and the second magnetoresistive element R2 corresponding to the selected memory cell in the opposite directions, to thereby allow write currents I1 and I2 to flow in the first write line 3 and the second write line 4, respectively. At the same time, the power is supplied aif from the power source circuit 8 so that a write current I3 flows in the third write line 5 corresponding to the selected memory cell. Because the third write line functions as an auxiliary magnetic field for selecting a specific element, the current in only one direction may flow.

Figure 8:
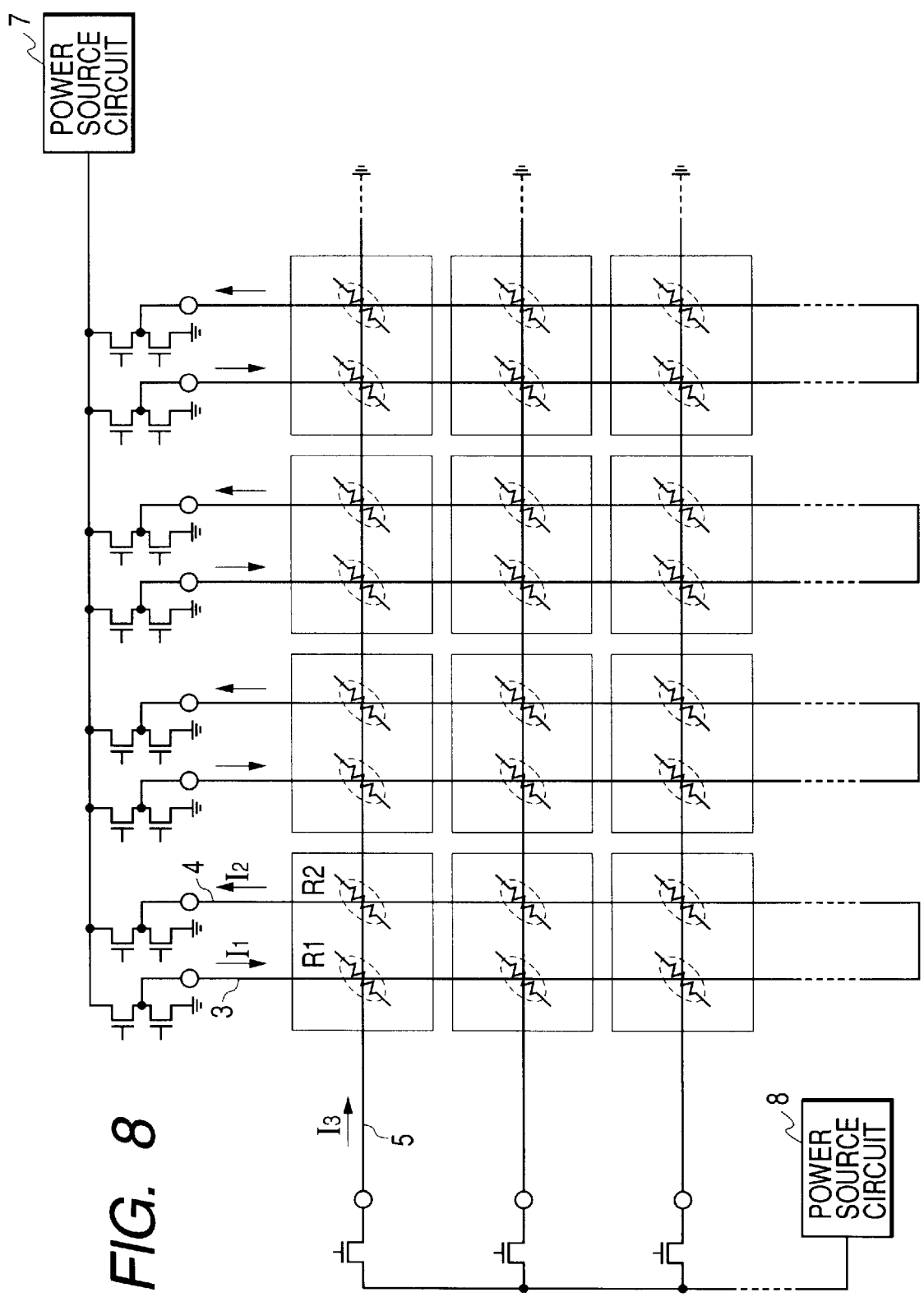
FIG. 8 is a circuit diagram showing the structure in which a write line is connected and folded at an end portion in a semiconductor memory device in which a plurality of memory cells shown in FIG. 1 are arranged two-dimensionally.

In this situation, the magnetizing direction of the first magnetic layer of each of the magnetoresistive elements is set to a controllable orientation due to the synthetic magnetic field of the magnetic field developed by the currents I1 and I2 that flows in the column-directional first write line 3 or second write 4, and the magnetic field developed by the current I3 that flows in the row-directional third write line 5. Another example is shown in FIG. 8. In FIG. 8, the write lines 3 and 4 are connected at an end portion and folded. Because the opposite currents always flow in the write lines 3 and 4, the two magnetoresistive elements within each of the memory cells can be made in the different magnetization states.

With the above-mentioned structure, the information can be read/written with respect to a desired memory cell among the plurality of memory cells which are disposed in the lattice.

In the conventional SRAM, the information cannot be retained in a state where the power source turns off. According to the structure of the present invention, since the information is retained by the magnetoresistive element, the information can be retained even when the power source turns off, thereby being capable of functioning as the non-volatile memory cell. Also, as to the creep phenomenon that may occur in the MRAM, according to the structure of the present invention, since the number of times of magnetization reverse can be remarkably reduced, the durability as the memory can be improved.

Also, in the normal SRAM, because the MOS transistor of one inverter is always in the on state, a d.c. current stationarily flows, resulting in a defect that the current is consumed. However, this problem can be solved by changing over the information retention to the magnetoresistive element. Therefore, for example, in the case where the memory cell reproduction is not conducted for a predetermined period, the power is saved by providing a means for automatically changing over to the information retention to the magnetoresistive element, for example, a control circuit shown in FIG. 5.

(Other Embodiments)

Figure 9:
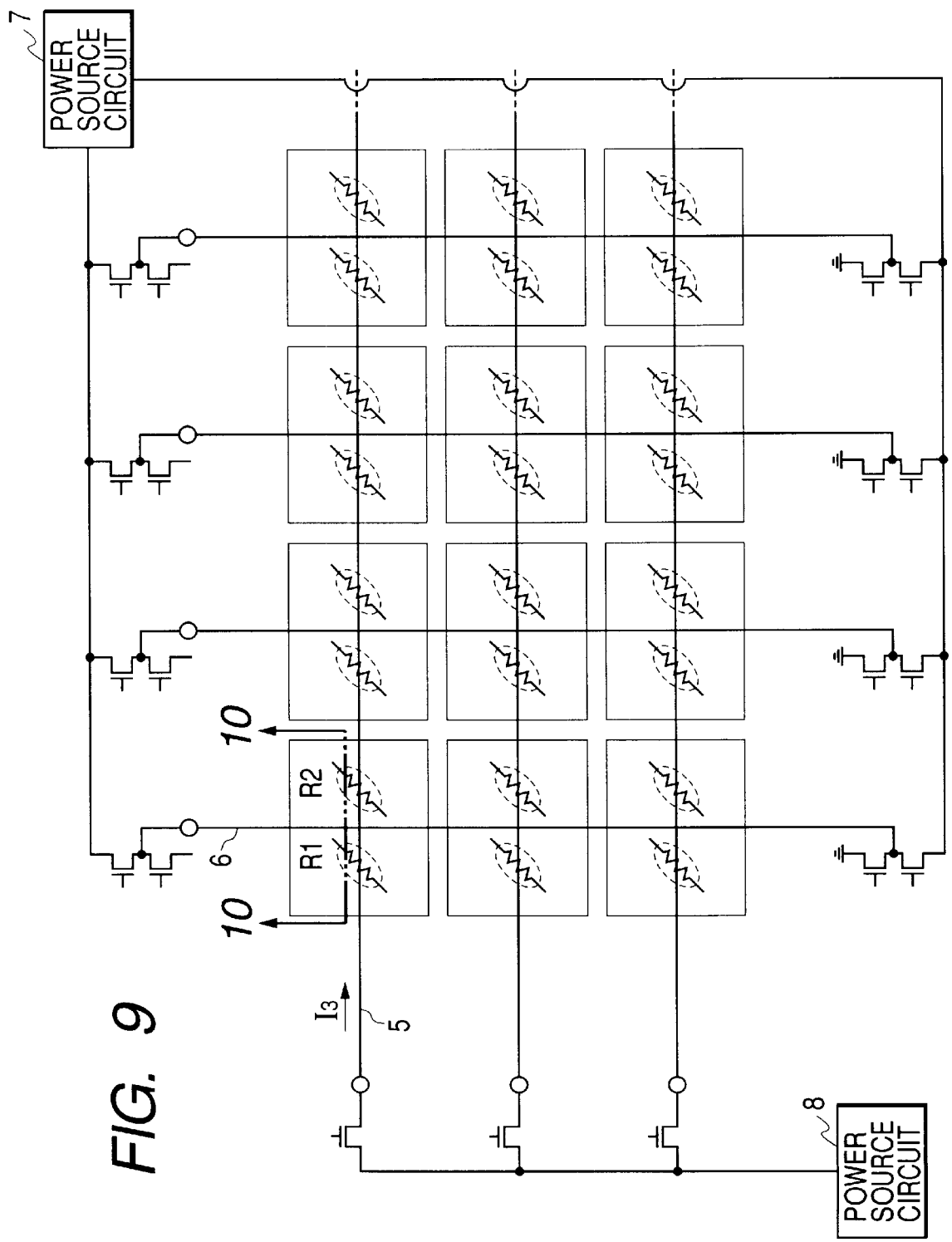
FIG. 9 is a circuit diagram showing a structure in which a write line is made common between two magnetoresistive elements within each of the memory cells by using the magnetoresistive element of the memory cell magnetized in a direction perpendicular to the film surface.

FIG. 9 shows a plan view of a semiconductor memory device in accordance with this embodiment. In this embodiment, the magnetoresistive element is magnetized in a direction perpendicular to the film surface, and a write line for changing the magnetization of the magnetic layer of the magnetoresistive element is disposed between the MOS transistors within the cell so that the write line is made common in the two magnetoresistive elements. Also, as in FIG. 5, for description, the first MOS transistor, the second MOS transistor, and the control line connected to the first input/output terminal and the second input/output terminal are omitted.

Figure 10:
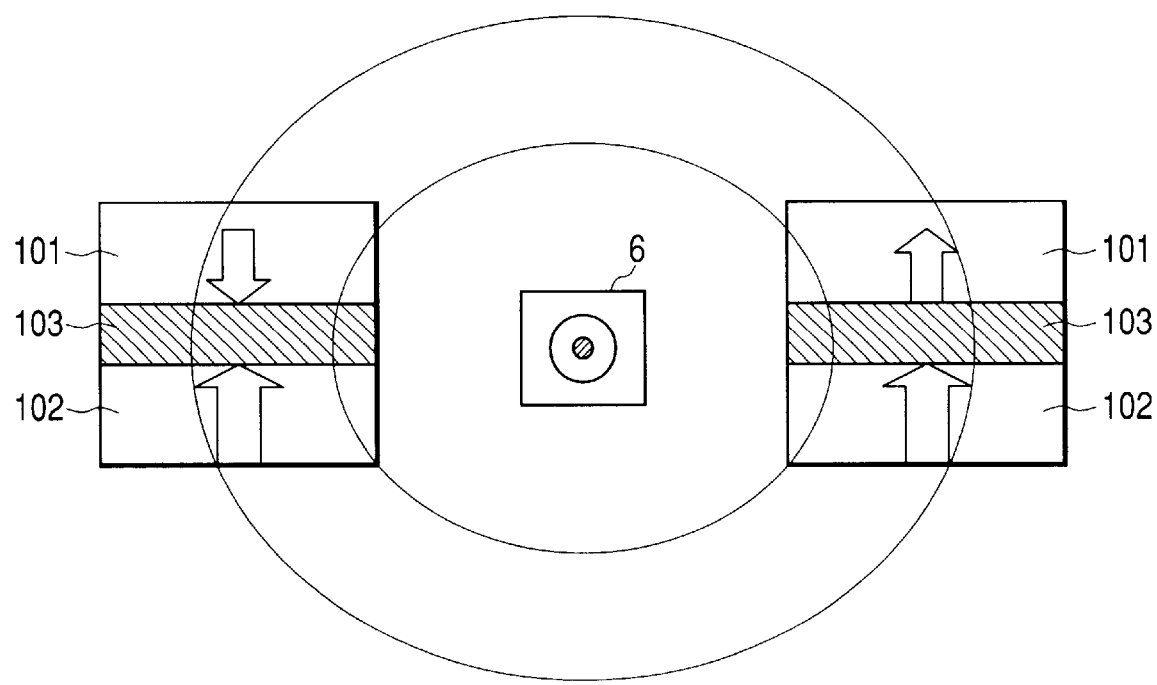
FIG. 10 shows a schematic cross-sectional view taken along a line 10—10 shown in FIG. 9.

FIG. 10 shows a schematic cross-sectional view taken along a line 10—10 shown in FIG. 9, and a diagram in which the current is allowed to flow from the front side toward the depthwise direction with respect to the paper surface. A lower layer is a layer large in the coercive force, and the magnetizing direction of the upper layer is changed by the write line. An upwise magnetic field is applied to the left magnetoresistive element, and a downwise magnetic direction is applied to the right magnetoresistive element. Therefore, the magnetizing states of the two magnetoresistive elements within the memory cell are different from each other, thereby being capable of retaining the information.

According to this embodiment, one write line is provided for each of the memory cells, and the current is made to flow in only one direction at the time of one write operation, thereby being capable of magnetizing the two magnetoresistive elements in the opposite directions. The number of write lines that determine the magnetizing direction of the magnetoresistive element can be reduced, the power can be saved, and the memory can be downsized.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A semiconductor memory device, which comprises:
   a plurality of memory cells each comprising:
      first and second MOS transistors of which sources are grounded and of which gates are connected to the respective drains;
      a first magnetoresistive element inserted between the drain of said first MOS transistor and a power source line; and
      a second magnetoresistive element inserted between the drain of said second MOS transistor and the power source line;
   first write unit which applies a voltage equal to or higher than a threshold voltage of the MOS transistor to any one of the gates of said first and second MOS transistors in accordance with write information with respect to said memory cell; and
   read unit which reads the information written in said memory cell by detecting the drain potentials of said first and second MOS transistors.

2. A semiconductor memory device according to claim 1, wherein each of said first magnetoresistive element and said second magnetoresistive element includes two magnetic layers different in a coercive force from each other, and a non-magnetic layer interposed between said magnetic layers, respectively, and wherein
   the resistances of said first magnetoresistive element and said second magnetoresistive element are different depending on the relative magnetizing directions of said two magnetic layers.

3. A semiconductor memory device according to claim 2, further comprising:
   a first write line for magnetizing at least one magnetic layer of said first magnetoresistive element in a predetermined direction due to a magnetic field caused by a current;
   a second write line for magnetizing at least one magnetic layer of said second magnetoresistive element in a predetermined direction due to a magnetic field caused by a current;
   potential detect unit which detects the potentials of the drains of said first and second MOS transistors before a power supply voltage is not applied to said power source line;
   second write unit which posses (flows) a predetermined current on said first write line and/or said second write line in accordance with the potential relationship of the drains of said first and second MOS transistors which is detected by said potential detecting means, respectively; and
   information reproducing unit which applies a predetermined voltage to the gates of said first and second MOS transistors in accordance with the resistance of said magnetoresistive element after the power is supplied to said power source line, respectively.

4. A semiconductor memory device according to claim 3, wherein said plurality of memory cells are arranged in a matrix, and said first write units, said read units, said voltage detecting units, said second write units, and said information reproducing units can be accessed to a desired memory cell among said plurality of memory cells, respectively.

5. A semiconductor memory device according to claim 3, wherein the magnetic film of said magnetoresistive element is magnetized in a direction perpendicular to a film surface.

6. A semiconductor memory device according to claim 5, wherein said first write line and said second write line are made common in each of said memory cells.

7. A semiconductor memory device according to claim 2, wherein said first magnetoresistive element and said second magnetoresistive element comprise a GMR element, respectively.

8. A semiconductor memory device according to claim 2, wherein said first magnetoresistive element and said second magnetoresistive element comprise a TMR element, respectively.

9. A semiconductor memory device having a plurality of memory cells, wherein each of said memory cells includes first and second inverters which has a power source line, a MOS transistor and a variable resistor, and forms a flip flop by connecting said first and second inverters annularly; wherein said semiconductor memory device comprises:
  first write units which applies a voltage to any one of the gates of said MOS transistors in accordance with write information with respect to said memory cell; and
  second write units which records the information by changing the resistance of said variable resistor.

10. A semiconductor memory device according to claim 9, wherein said variable resistor comprises a magnetoresistive element.

11. A semiconductor memory device according to claim 10, wherein said second write units comprises a wiring for allowing a current to flow to develop a magnetic field.

12. A semiconductor memory device according to claim 9, wherein in each of said memory cells, said variable resistors have respective different resistances when information is recorded.

13. A semiconductor memory device according to claim 9, wherein there are provided a state in which the information is retained by said flip flop, and a state in which the information is retained by said variable resistor.

* * * * *

UNITED STATES PATENT AND TRADEMARK OFFICE
CERTIFICATE OF CORRECTION

PATENT NO. : 6,522,575 B2
DATED : February 18, 2003
INVENTOR(S) : Fumihiro Inui

It is certified that error appears in the above-identified patent and that said Letters Patent is hereby corrected as shown below:

Column 1,
Line 29, "012" should read -- Q12 --;
Line 57, "Q110" should read -- Q11 --; and
Line 66, "terminal 112" should read -- terminal 12 --.

Column 2,
Line 64, "not." should read -- not --.

Column 4,
Line 41, "flip flop" should read -- flip-flop --.

Column 5,
Line 56, "transistor Q" should read -- transistor Q2 --; and
Line 64, "flip flop." should read -- flip-flop. --; and
"flip flop" should read -- flip-flop --.

Column 6,
Line 28, "lease" should read -- least --.

Column 10,
Line 55, "aif" should be deleted; and
Line 67, "write 4," should read -- write line 4, --.

Column 12,
Line 57, "posses" should read -- passes --; and
Line 61, "means," should read -- unit, --.

Column 13,
Line 23, "has" should read -- have --; and
Line 24, "flip flop" should read -- flip-flop --.

UNITED STATES PATENT AND TRADEMARK OFFICE
CERTIFICATE OF CORRECTION

PATENT NO.     : 6,522,575 B2
DATED          : February 18, 2003
INVENTOR(S)    : Fumihiro Inui It is certified that error appears in the above-identified patent and that said Letters Patent is hereby corrected as shown below:

Column 14,
Line 2, "applies" should read -- apply --;
Line 6, "records" should read -- record --;
Line 13, "comprises" should read -- comprise --; and
Line 22, "flip flop," should read -- flip-flop, --.

Signed and Sealed this

Eighteenth Day of November, 2003

JAMES E. ROGAN
*Director of the United States Patent and Trademark Office*